United States Patent
Katoh

(10) Patent No.: US 6,252,465 B1
(45) Date of Patent: Jun. 26, 2001

(54) DATA PHASE LOCKED LOOP CIRCUIT

(75) Inventor: Hisao Katoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/427,582

(22) Filed: Oct. 27, 1999

(30) Foreign Application Priority Data

Jun. 25, 1999 (JP) .................................................. 11-179736

(51) Int. Cl.[7] ........................................................ H03L 7/08
(52) U.S. Cl. .............................. 331/25; 331/1 A; 331/57; 327/158; 327/159; 327/161
(58) Field of Search .................................... 327/158, 159, 327/161; 331/1 A, 25, 57

(56) References Cited

U.S. PATENT DOCUMENTS 5,799,048 * 8/1998 Farjad-Rad et al. .................. 375/360

FOREIGN PATENT DOCUMENTS

| 7162296 | 6/1995 | (JP) . |
| 10117142 | 5/1998 | (JP) . |
| 118552 | 1/1999 | (JP) . |

* cited by examiner

Primary Examiner—Arnold Kinkead
(74) Attorney, Agent, or Firm—Leydig, Voit & Mayer, Ltd.

(57) ABSTRACT

A phase comparator circuit reducing the effects of offset and jitter, and a data Phase Locked Loop circuit incorporating the phase comparator circuit. The phase comparator circuit includes a Delay Locked Loop circuit for outputting a delay, signal PLDTD with a delay according to an oscillation frequency of a voltage controlled oscillator, with respect to an input data PLDT, a D-type flip-flop for outputting a delay signal PLDTL by latching an input data PLCK according to an oscillation clock PLCK output from a voltage controlled oscillator, and a phase comparator for comparing phases of delay signals PLDTD and PLDTL.

8 Claims, 13 Drawing Sheets

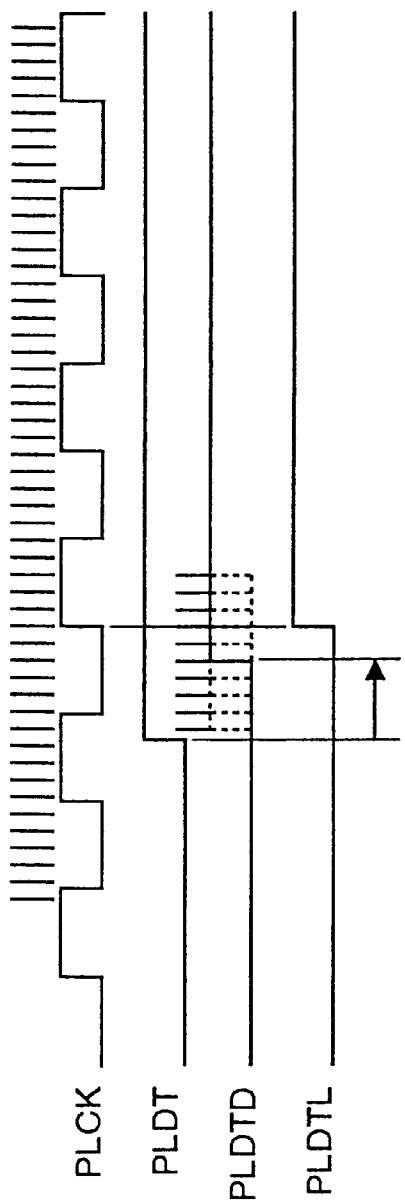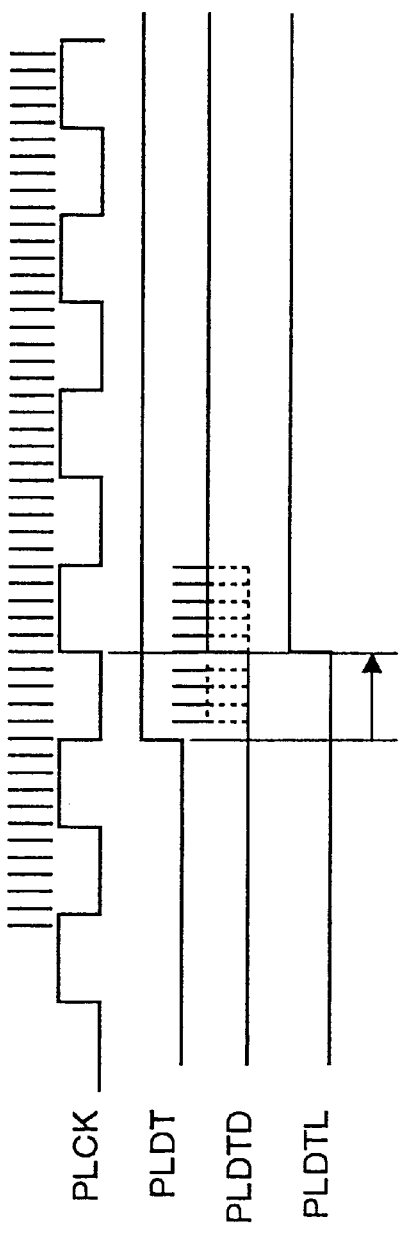

DATA PHASE LOCKED LOOP CIRCUIT

FIELD OF THE INVENTION

The present invention relates to a phase comparator circuit which generates a synchronous clock for reading a reproduced signal as digital information output from an information reproducing device such as an optical disk device. Further, the invention relates to a data PLL (Phase Locked Loop) circuit incorporating the phase comparator circuit.

BACKGROUND OF THE INVENTION

A reproduced signal output from a digital information reproducing device such as an optical disk device is represented by a digital value. In order to extract reproduced data from such a reproduced signal, it is necessary to extract the bit structure of the reproduced data by synchronization with a reference clock.

The reference clock is typically generated by a PLL (Phase Locked Loop) circuit, and directed to a digital processing circuit such as a decoding circuit. The above-mentioned PLL circuit is not only used for such data reproduction, but also adopted for various applications. For example, the PLL circuit is used for maintaining clocks input to a plurality of circuits in an integrated circuit in synchronization, and for frequency tuning or as a detection circuit in communication device.

In particular, the PLL circuit used for data reproduction is called a data PLL circuit, and the reproduced signal is represented by a continuous rectangular pulse train of a width which is an integer multiple of a reference clock. Therefore, by inputting the reproduced signal, the extraction of the reference clock of the reproduced signal and the synchronization of the reference clock and the reproduced signal are performed simultaneously.

FIG. 11 is a block diagram showing a schematic structure of a conventional data PLL circuit. A conventional data PLL circuit 100 shown in FIG. 11 includes a phase comparator circuit 101, a frequency comparator circuit 102, charge pumps (CP) 103 and 104, a low-pass filter (LPF) 105, and a voltage control oscillator (VCO) 106.

The phase comparator circuit 101 shown in FIG. 11 compares the leading edge of input data PLDT which is equivalent to the above-mentioned reproduced signal and the leading edge of an oscillation clock PLCK output from the voltage control oscillator 106. When the leading edge of the oscillation clock PLCK is delayed with respect to the input data PLDT, the phase comparator circuit 101 inputs a signal PLCPP as a low level signal "L" to the charge pump 104 during that period.

On the other hand, when the leading edge of the oscillation clock PLCK is ahead of the input data PLDT, the phase comparator circuit 101 inputs a signal PLCPN as a high level signal "H" to the charge pump 104 during that period.

In other words, the phase comparator circuit 101 is a circuit that outputs a signal for reducing the frequency of the clock PLCK when the phase of the oscillation clock PLCK is ahead of the input data PLDT and outputs a signal for increasing the frequency of the clock PLCK when the phase of the oscillation clock PLCK is delayed with respect to the input data PLDT, and inputs these signals to the charge pump 103 in the later stage.

Similarly, the frequency comparator circuit 102 is a circuit that outputs a signal for reducing the frequency of the oscillation clock PLCK when the frequency of the oscillation clock PLCK is higher than that of the input data PLDT and outputs a signal for increasing the frequency of the oscillation clock PLCK when the frequency of the oscillation clock PLCK is lower than that of the input data PLDT, and inputs these signals to the charge pump 104 in the later stage.

For instance, each of the charge pumps 103 and 104 is constructed such that a current source for supplying positive charge (hereinafter referred to as the positive current source), a P-channel MOS transistor, an N-channel MOS transistor, and a current source for supplying negative charge (hereinafter referred to as the negative current source) are sequentially connected in series between the power supply and the ground. The node of the P-channel MOS transistor and the N-channel MOS transistor (node N) is connected to an input section of a low-pass filter 105 in the next stage.

According to this structure, the above-mentioned signal PLCPP is input to the gate of the P-channel MOS transistor, and the signal PLCPN is input to the gate of the N-channel MOS transistor. Furthermore, the output sections of the charge pumps 103 and 104 are connected to each other, and the output currents of the charge pumps are added together and input to the low-pass filter 105 in the next stage.

When the signal PLCPP representing a low level is input to the charge pumps 103 and 104 having such a structure, the P-channel MOS transistor turns into an ON state, and a positive charge is supplied to the node N from the positive current-source. More specifically, the low-pass filter 105 is supplied with the positive charge of a quantity obtained by integrating the current value of the positive current source over a period of time in which the signal PLCPP has a low level.

On the other hand, when the signal PLCPN representing a high level is input, the N-channel MOS transistor turns into an ON state, and a negative charge is supplied to the node N from the negative current source. More specifically, the low-pass filter 105 is supplied with the negative charge of a quantity obtained by integrating the current value of the negative current source over a period of time in which the signal PLCPN has a high level.

For example, the low-pass filter 105 is constructed by connecting a resistor and a capacitor in series between the node of the charge pumps 103 and 104 and the ground. This low-pass filter accumulates the charges supplied from the charge pumps 103 and 104 in the capacitor through the resistor, and removes harmonic components and generates a control voltage for controlling the voltage control oscillator 106 in the next stage.

The voltage control oscillator 106 is an oscillator which is supplied with the control voltage generated by the low-pass filter 105, and outputs the oscillation clock PLCK of an oscillation frequency which is determined by the input control voltage. This oscillation clock PLCK is a reference clock used as a synchronizing signal for the reproduced data. Further, the oscillation clock PLCK is input to the phase comparator circuit 101 and frequency comparator circuit 102, thereby forming a negative feedback loop.

With the function of the negative feedback, the oscillation clock PLCK coincides (is locked) with the frequency and phase of the input data PLDT, thereby allowing extraction of a reference clock synchronized with the input data PLDT from the input data PLDT.

Incidentally, in the data PLL circuit 100 shown in FIG. 11, the charge pumps 103 and 104 and the low-pass filter 105 can be achieved equivalently by digital circuits. Besides, all of the structures including these members, the phase comparator circuit 101, frequency comparator circuit 102, and voltage control oscillator 106 can be changed into digital form.

FIG. 12 is a circuit diagram showing the internal structure of the phase comparator circuit 101. As illustrated in FIG. 11, the phase comparator circuit 101 includes four D-type flip-flops F111 to F114, an EOR gate G111, an AND gate G112, andaninverterG113. Meanwhile, FIG. 13 is a timing chart for explaining the operation of the phase comparator circuit 101 and the operation of the above-mentioned data PLL circuit 100.

Referring now to FIGS. 12 and 13, the following description will explain an operation in the phase comparator circuit 101, and an operation of the data PLL circuit 100 associated with the operation of the phase comparator circuit is 101.

First, the input data PLDT is input to one of the input terminals of the EOR gates G111. Since an inverted output (Q) of the D-type flip-flop F112 is input to the other input terminals of the EOR gate G111, the EOR gate G111 outputs a signal "H" representing a high level when the logical level of the input data PLDT and the logical level indicated by the inverted output of the D-type flip flop F112 differ from each other.

Here, the signal output from the EOR gate is input to the D-type flip-flop F111 as the clock input (T), and a data input (Q) of the D-type flip-flop F111 is pulled up to a high level. Accordingly, the high-level signal "H" output from the EOR gate G111 is latched by the D-type flip-flop F111.

Moreover, the D-type flip-flop F111 outputs an inverted output (Q) as the signal PLCPP. In the above-mentioned state, the signal PLCPP indicates a low-level signal "L".

The D-type flip-flop F112 is supplied with its inverted output ($\overline{Q}$) as data input (D) and the data output (Q) of the D-type flip-flop F111 as the clock input (T). Therefore, when the D-type flip-flop F111 latches "H" as described above, the D-type flip-flop F112 inverts the value of the logical level held until then.

Consequently, the logical level indicated by the inverted output ($\overline{Q}$) of the D-type flip-flop F112 and the logical level of the input data PLDT are equal to each other, and the output of the EOR gate G111 changes into a signal "L" representing a low level.

Besides, the D-type flip-flop F113 is supplied with the data output (Q) of the D-type flip-flop F111 as the data input (Q) and the oscillation clock PLCK as the clock input (T). Therefore, in the above-mentioned state in which the D-type flip-flop F111 latches "H", the D-type flip-flop F113 latches "H" with the leading edge of the oscillation clock PLCK.

Furthermore, since the inverted output (Q) of the D-type flip-flop F113 is input to a reset terminal (inverted input) of the D-type flip-flop F111, when the D-type flip-flop F111 lathes "H", the D-type flip-flop F111 is reset.

The D-type flip-flop F114 is supplied with the data output (Q) of the D-type flip-flop F113 as the data input (D) and the output of the inverter G113 as the clock input (T). Since the inverter G113 inverts and outputs the input oscillation clock PLCK, the D-type flip-flop F114 lathes "H" as the data output (Q) of the D-type flip-flop F113 with the trailing edge of the oscillation clock PLCK.

The data output (Q) of the flip-flop F113 and the data output (Q) of the D-type flip-flop F114 are input to the AND gate G112. The AND gate G112 outputs its output as the signal PLCPN, and the signal PLCPN indicates a high level "H" when the logical levels of the input signals both indicate "H".

With the above-explained operation, the signal PLCPP output from the phase comparator circuit 101 indicates a low-level signal "L" in a period that starts with the latching of "H" by the D-type flop-flop F111 by a change of the input data PLDT and ends with the reset by the inverted output (Q) of the D-type flip-flop F113. On the other hand, when both of the data output (Q) of the D-type flip-flop F113 and the data output (Q) of the D-type flip-flop F114 are "H", the signal PLCPN indicates a high-level signal "H".

More specifically, as illustrated in FIG. 13, the signal PLCPP represents "L" in a period between the leading edge or the trailing edge of the input data PLDT and the trailing edge of the next oscillation clock PLCK. During the period when the signal PLCPP is "L", the charge pump 103 supplies a positive charge to the low-pass filter 105, and increases the control voltage to be input to the voltage control oscillator 106 as shown in FIG. 13 (the timing chart of the LPF in FIG. 13).

On the other hand, as illustrated in FIG. 13, the signal PLCPN represents "H" in a period between the leading edge of the signal PLCPP and the trailing edge of the next oscillation clock PLCK. During the period when the signal PLCPN is "H", the charge pump 103 supplies a negative charge to the low-pass filter 105, and decreases the control voltage to be input to the voltage control oscillator 106 as shown in FIG. 13 (the timing chart of the LPF in FIG. 13).

In particular, the above-described phase comparator circuit 101 is operated so as to synchronize the trailing edge of the oscillation clock PLCK with the leading edge or the trailing edge of the input data PLDT, and the signals PLCPP and PLCPN of the phase comparator circuit 101 have a uniform pulse width when the phase difference between the input data PLDT and oscillation clock PLCK is zero.

The conventional data PLL circuit 100 is configured as explained above, and operates so as to minimize the frequency difference and phase difference between the input data PLDT and the oscillation clock PLCK of the voltage control oscillator 106.

However, as illustrated in FIG. 13, even when the phase difference between the input data PLDT and the oscillation clock PLCK is zero, the phase comparator circuit 101 constituting the conventional data PLL circuit 100 outputs the signals PLCPP and PLCPN whose pulse widths are equal to each other. Therefore, the increase/decrease of the control signal resulting from these signals PLCPP and PLCPN causes the jitter in the oscillation clock to increased jitter.

Moreover, due to the delay of the gates constituting the data PLL circuit 100 and the unbalance between the currents supplied from the positive current source and negative current source in the charge pumps 103 and 104, the locked state is sometimes deviated from an ideal phase-locked state. In the conventional data PLL circuit 100, since the locked state is uniformly determined by the circuit structure, it is difficult to set an offset for resetting the deviation of the locked state.

SUMMARY OF THE INVENTION

The present invention has been implemented to solve the above-mentioned problems. An object of the present invention is to provide a phase comparator circuit capable of reducing the effects of offset and jitter, and a data PLL circuit incorporating the phase comparator circuit.

According to this invention, a delay unit such as a DLL (Delay Locked Loop) circuit delays the input data such as a reproduced signal by an amount corresponding to the oscillation frequency of the voltage control oscillator (VCO) to output the first delay signal, a latching unit such as a D-type flip-flop latches the input data according to the oscillation clock output from the voltage control oscillator to output the second delay signal, and a phase comparing unit compares the phase of the first delay signal and the phase of the second delay signal. It is therefore possible to provide a delay proportional to the oscillation frequency of the voltage control oscillator, with respect to the input data.

According to the invention, the delay unit includes a plurality of the second variable delay stages which have the same structure and characteristics as the first variable delay stages constituting the voltage control oscillator and are connected in cascade, and the delay control current which is supplied to the switch sections of the first variable delay stages of the voltage control oscillator is also used as the delay control current to be input into the switch sections of the second variable delay stages. It is therefore possible to provide a delay proportional to the oscillation frequency of the voltage control oscillator, with respect to the input data.

According to the invention, the number of the second variable delay stages is an integral multiple of the number of the first variable delay stages constituting the voltage control oscillator, so that it is possible to set the amount of delay provided by the delay unit to a divisor of the oscillation cycle of the voltage control oscillator.

According to the invention, the phase comparing unit performs a phase comparison and a frequency comparison between the first delay signal and the second delay signal simultaneously, so that there is no need to newly provide a frequency comparator circuit, thereby enabling simplification of the circuit structure.

According to the invention, the phase comparing unit outputs a signal for increasing the frequency of the oscillation clock of the voltage control oscillator only in a period between the generation of a new leading edge of the first delay signal and the generation of a new leading edge of the second delay signal, and outputs a signal for reducing the frequency of the oscillation clock of the voltage control oscillator only in a period between the generation of a new leading edge of the second delay signal and the generation of a new leading edge of the first delay signal. Therefore, in a phase-locked state, no signals are output from this phase comparator circuit.

According to the invention, one of the outputs of the second variable delay stages is selected by a selecting unit and the selected output of the second variable delay stage is output as the first delay signal, so that it is possible to control the amount of delay.

According to the invention, since the selecting unit receives only the outputs of even-numbered second variable delay stages among the plurality of the second delay stages, it is possible to appropriately control the delay while considering the polarity of the clock.

According to the invention, a transistor size of the switch section of the second variable delay stage is designed to be an integral multiple of a transistor size of the switch section of the first variable delay stage, so that it is possible to control the delay by a unit of a divisor of the oscillation cycle of the voltage control oscillator because of the difference between the sizes of the transistors.

According to the invention, a frequency divider unit for dividing the oscillation clock is further provided and the latching unit latches the input data according to a result of division output from the frequency divider unit, instead of the oscillation clock, so that it is possible to increase the oscillation frequency of the voltage control oscillator and consequently reduce the unit of control of the delay of the delay unit.

Other objects and features of this invention will become apparent from the following description with reference to the accompanying drawings.

BRIEF DESCRIPTION OF THE DRAWINGS

FIG. 8A and FIG. 8B are timing charts for explaining the operation of the data PLL circuit according to the third embodiment;

DESCRIPTION OF THE PREFERRED EMBODIMENTS

The following description will explain in greater detail embodiments of a data PLL circuit according to the present invention with reference to drawings. Incidentally, these embodiments are not intended to limit the present invention.

Figure 1:
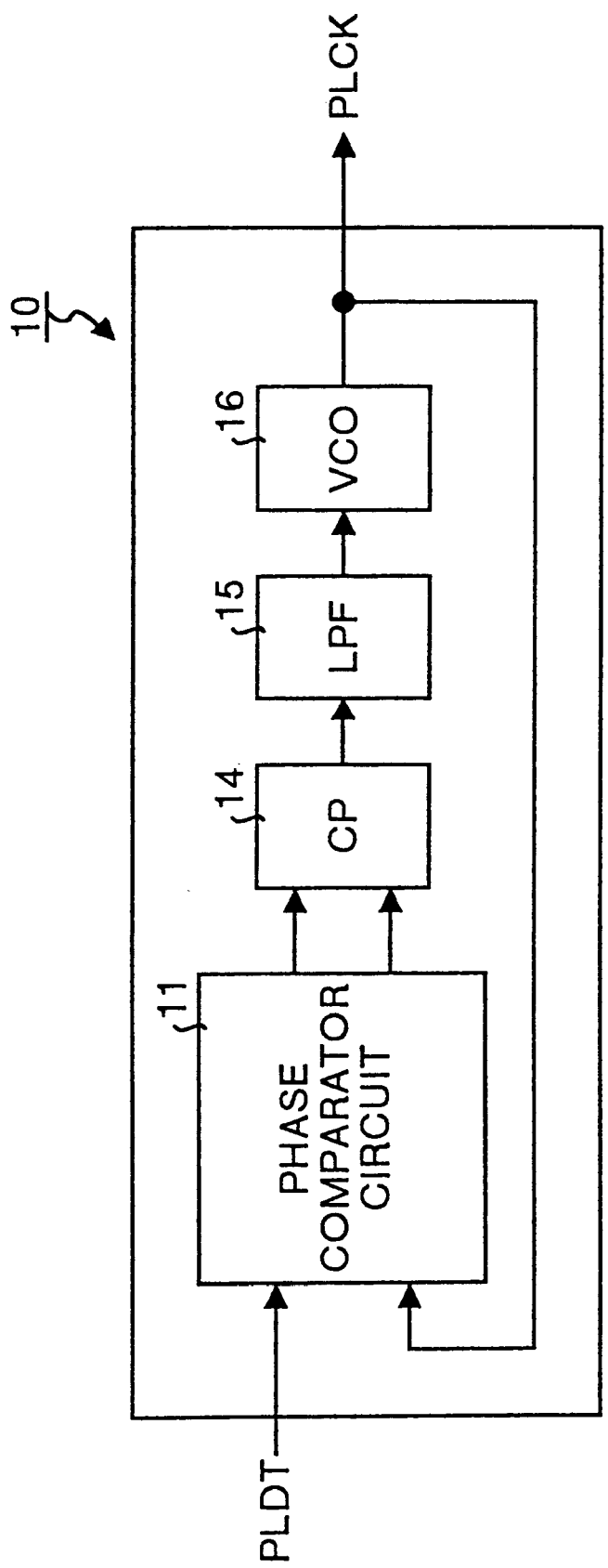
FIG. 1 is a block diagram showing a schematic structure of a data PLL circuit according to a first embodiment of the invention.

First, a data PLL circuit according to a first embodiment of the invention will be explained. FIG. 1 is a block diagram showing a schematic structure of a data PLL circuit according to the first embodiment.

A data PLL circuit 10 shown in FIG. 1 includes a phase comparator circuit 11, a charge pump (CP) 14, a low-pass filter (LPF) 15, and a voltage control oscillator (VCO) 16. Since the charge pump 14, low-pass filter 15 and voltage control oscillator 16 have the same internal structures as those of charge pump 103, low-pass filter 105 and voltage control oscillator 106 shown in FIG. 10, the explanation thereof will be omitted here.

As described in detail later, the phase comparator circuit 11 in FIG. 1 performs the functions of a phase comparator circuit 101 and frequency comparator circuit 102 shown in FIG. 10 concurrently, and is provided with a DLL (Delay Locked Loop) circuit. The provision of the phase comparator circuit 11 is a characteristic of the data PLL circuit 10 of the first embodiment.

Figure 2:
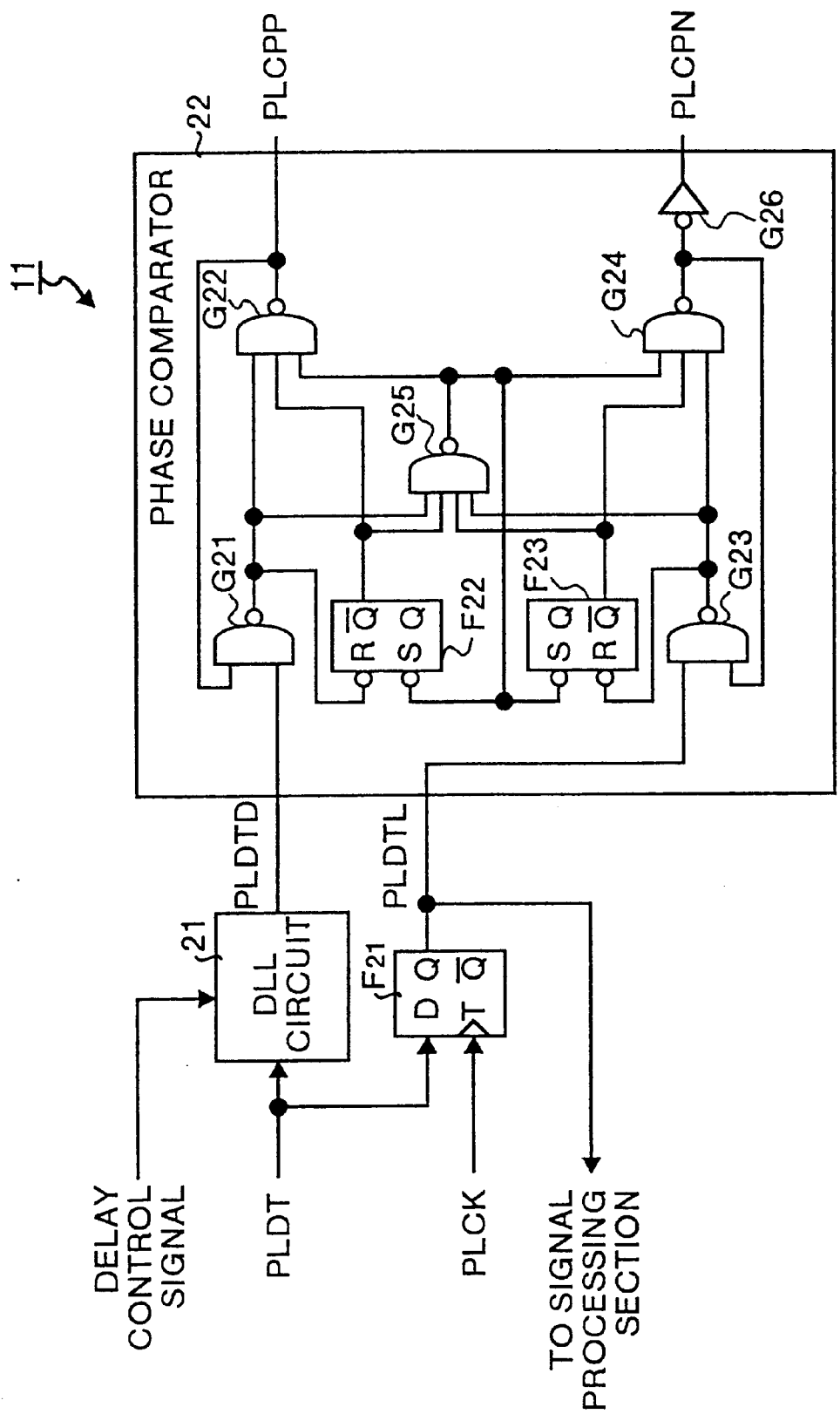
FIG. 2 is a block diagram showing a circuit structure of a phase comparator circuit of the data PLL circuit according to the first embodiment.

FIG. 2 is a block diagram showing a circuit structure of the phase comparator circuit 11. The phase comparator circuit 11 as shown in FIG. 2 includes a DLL circuit 21 for providing a predetermined delay, a D-type flip-flop F21, and a phase comparator 22. Input data PLDT is first input to the DLL circuit 21, and output as a delay signal PLDTD after a delay according to a delay control signal.

Moreover, the input data PLDT is input as a data input (D) to the D-type flip-flop F21. An oscillation clock PLCK which is output from the voltage control oscillator 16 is input as a clock input (T) to the D-type flip-flop F21, and the D-type flip-flop F21 latches the data input PLDT with the leading edge of the input oscillation clock PLCK. The signal latched by the D-type flip-flop F21 is output as a delay signal PLDTL.

Figure 11:
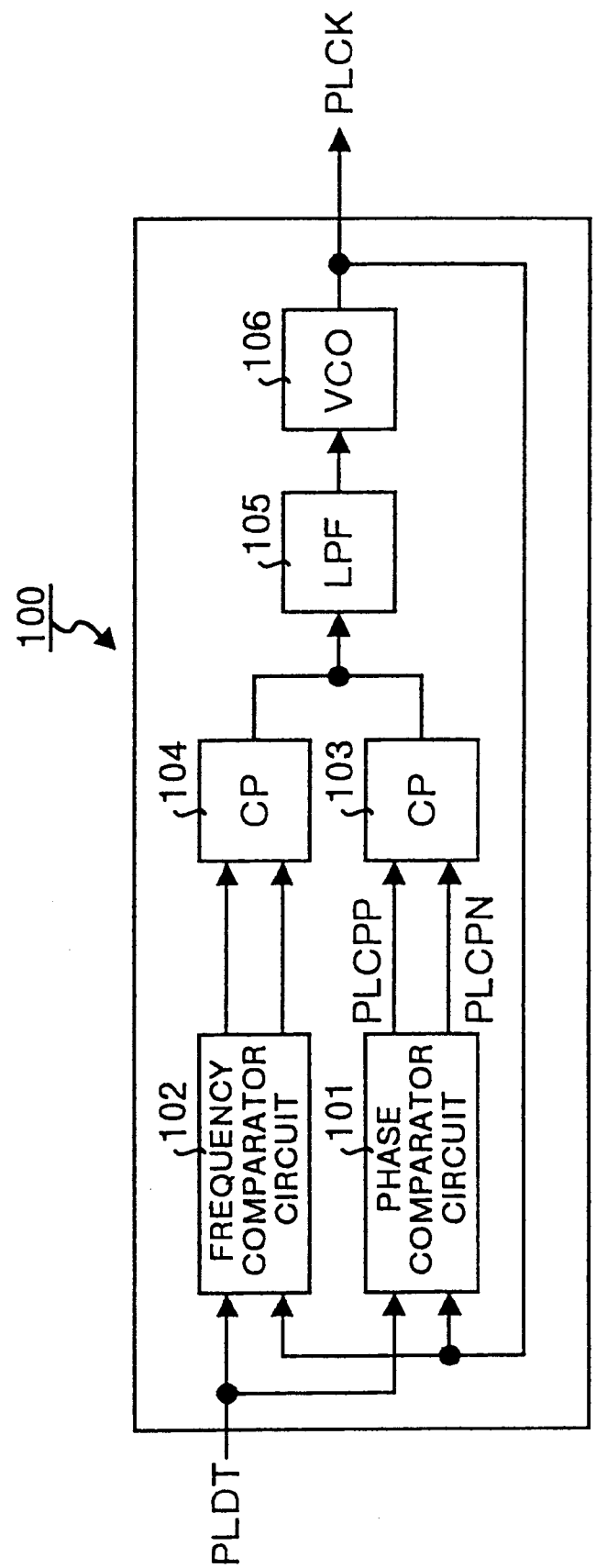
FIG. 11 is a block diagram showing a schematic structure of a conventional data PLL circuit.
Figure 12:
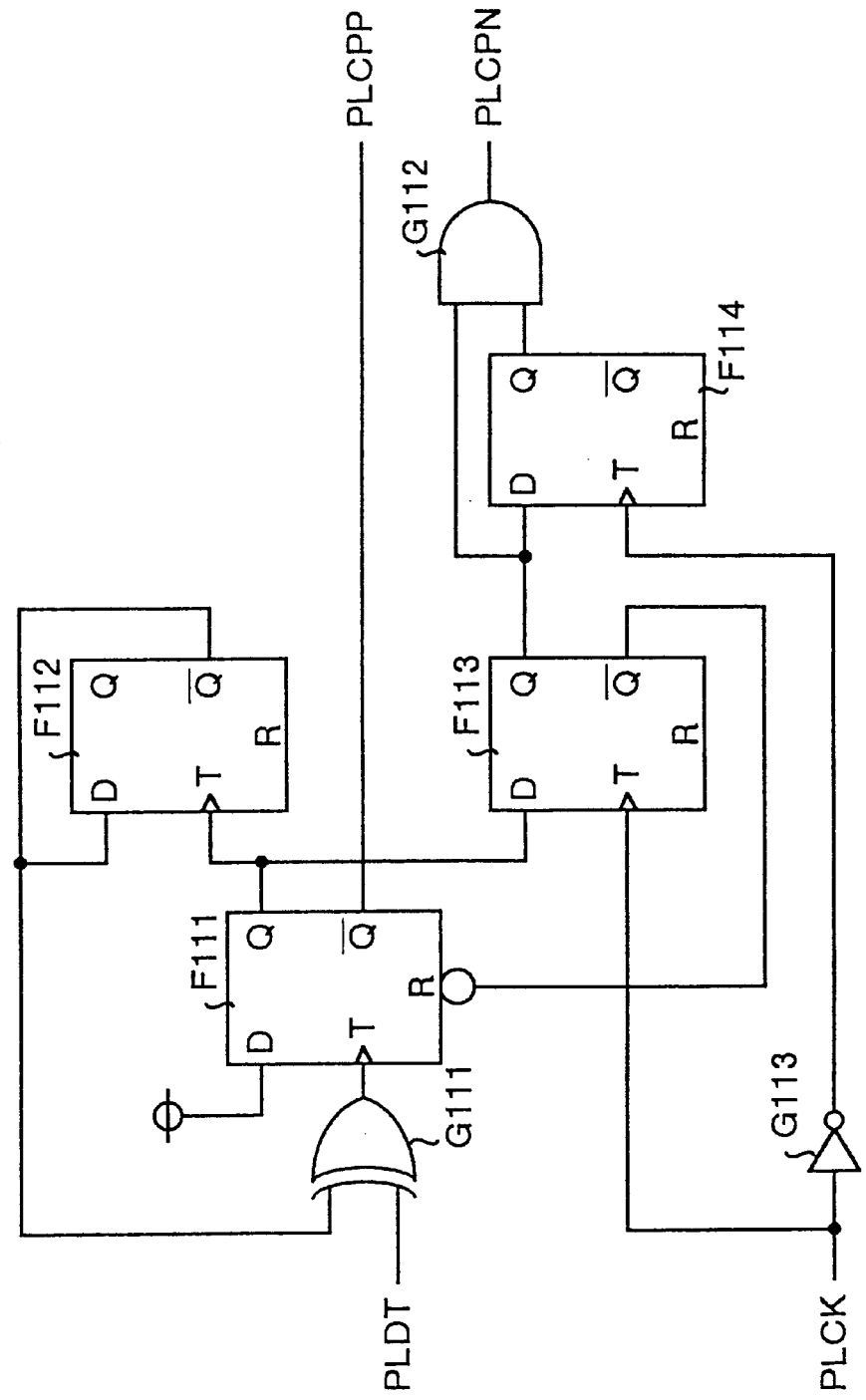
FIG. 12 is a circuit diagram showing an internal structure of the phase comparator circuit in the conventional data PLL circuit.
Figure 13:
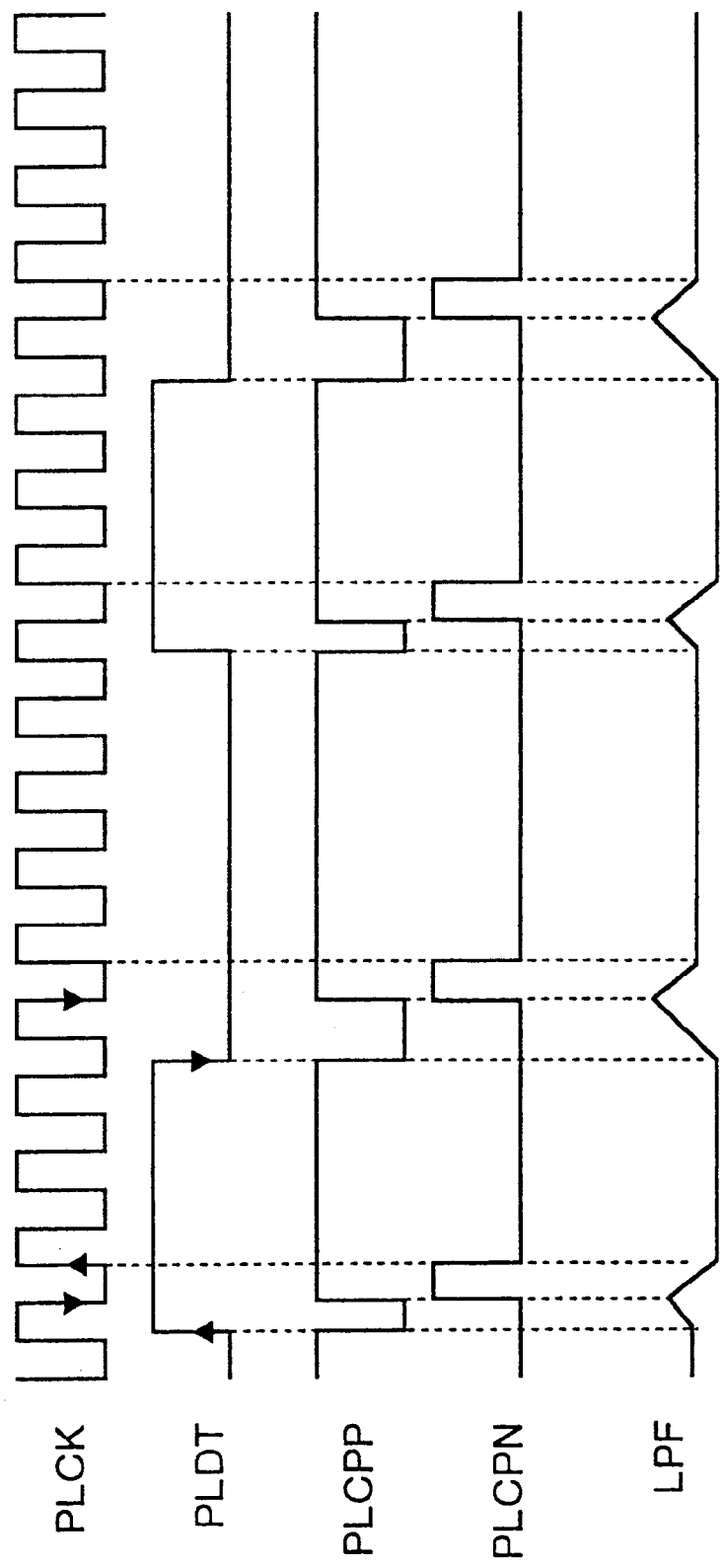
FIG. 13 is a timing chart for explaining the operation of the conventional data PLL circuit.

The above-described delay signals PLDTD and PLDTL are input to the phase comparator 22 where the phase difference between these delay signals is detected. Incidentally, the phase comparator 22 outputs a signal PLCPP or PLCPN having the above-mentioned pulse width, like the phase comparator circuit 101 shown in FIG. 11, furthermore indicating the phase difference of the delay signal PLDTL with respect to the delay signal PLDTD in terms of pulse width.

Here, the internal structure of the phase comparator 22 will be explained. As illustrated in FIG. 2, the phase comparator 22 includes five NAND gates G21 to G25, an inverter G26, and two R-S flip-flops F22 and F23.

First, the delay signal PLDTD is input to one of the input terminals of the NAND gate G21. Since the signal PLCPP output from the NAND gate G22 is input to the other input terminal of the NAND gate G21, only when both the logical level of the delay signal PLDTD and the logical level of the output of the NAND gate G22 represent high-level signals "H", the NAND gate G21 outputs a signal "L" representing a low level.

Here, the signal output from the NAND gate G21 is input as a reset input (R) into an inverted input of the R-S flip-flop F22. The R-S flip-flop F22 is supplied with an output of the NAND gate G25 as a set input (S) of an inverted input.

Meanwhile, the delay signal PLDTL is input to one of the input terminals of the NAND gate G23. Since a signal output from the NAND gate G24 is input to the other input terminal of the NAND gate G23, only when both the logical level of the delay signal PLDTL and the logical level of the output of the NAND gate G24 represent high-level signals "H", the NAND gate G23 outputs a signal "L" representing a low level.

Here, the signal output from the NAND gate G23 is input as a reset input (R) of the inverted input into the R-S flip-flop F23. The R-S flip-flop F23 is supplied with an output of the NAND gate G25 as a set input (S) of the inverted input.

The NAND gate G25 is supplied with the output of the NAND gate G21, the output of the NAND gate G23, the inverted output (Q) of the R-S flip-flop F22 and the inverted output (Q) of the R-S flip-flop F23, and its output is input to the NAND gates G22 and G24.

Moreover, the output of the NAND gate G24 is input to the inverter G26, and the inverter G26 outputs the signal PLCPN.

The phase comparator 22 with the above-described structure is well known as a phase comparator capable of performing a phase comparison and a frequency comparison concurrently. Therefore, the internal operation thereof will be omitted here.

Figure 3:
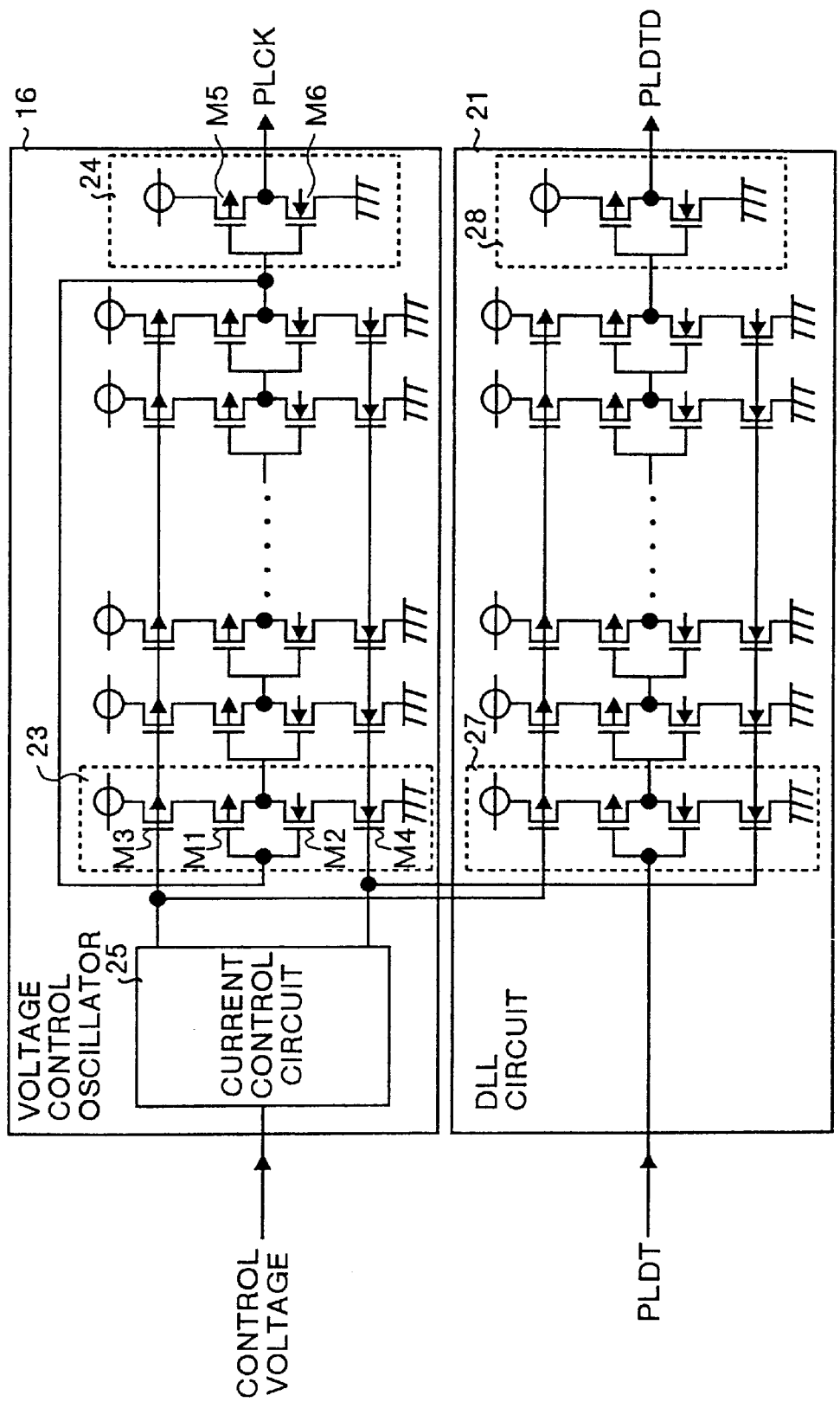
FIG. 3 is a circuit diagram showing an internal structure of a DLL circuit of the data PLL circuit according to the first embodiment.

Next, the above-mentioned DLL circuit 21 will be explained. FIG. 3 is a circuit diagram showing an internal structure of the DLL circuit 21, together especially with a circuit structure of the voltage control oscillator 16. The circuit structure of the voltage control oscillator 16 will be at first explained. The voltage control oscillator 16 shown in FIG. 3 is a well known circuit composed of a current control circuit 25, an odd number of variable delay stages 23 and an output stage 24.

The current control circuit 25 is a circuit for converting a control voltage supplied from the low-pass filter 15 into a current. With this current, delay control of the variable delay stages 23 is carried out. The variable delay stage 23 is a circuit capable of changing a delay time of an inverter which is formed by complementary connection of a P-channel MOS transistor M1 and an N-channel MOS transistor M2 with the use of a P-channel MOS transistor M3 which controls a current source disposed on the power supply side and an N-channel transistor M4 which controls a current source disposed on the ground side.

In the variable delay stages 23, the MOS transistors M1 and M2 are considered as a switch, and the ON/OFF time of the switch of each stage, i.e., the delay time, is determined from a relationship between the currents supplied from the current sources disposed on the power supply side and ground side and the load capacitance such as the input capacitance and wiring capacitance of the next stage. Furthermore, the voltage control oscillator 16 controls the entire delay, i.e., the oscillation frequency, by connecting a plurality of the variable delay stages 23 in a ring form.

The output stage 24 is an inverter formed by complementary connection of a P-channel MOS transistor M5 and an N-channel MOS transistor M6, and extracts the oscillation clock PLCK of the above-mentioned oscillation frequency.

Besides, the DLL circuit 21 for introducing the predetermined delay includes a plurality of variable delay stages 27 having the same structure as the variable delay stages 23 in the voltage control oscillator 16, and an output stage 28 having the same structure as the output stage 24. However, the variable delay stages 27 are not connected in a ring form as in the voltage control oscillator 16, and are simply connected in cascade. Therefore, the input data PLDT is input to the first variable delay stage 27, and the delay signal PLDTD is output from the output stage 28.

The DLL circuit 21 is characterized in that the delay control of each variable delay stage 27 is performed commonly by the use of the current control circuit 25 of the voltage control oscillator 16. Specifically, the delay control signal input to the PLL circuit 21 as shown in FIG. 2 is a current signal output from the current control circuit 25 of the voltage control oscillator 16.

By controlling the current source provided in each variable delay stage 27 of the DLL circuit 21 with the same signal as the signal for controlling the delay of the voltage control oscillator 16, it is possible to provide a delay according to the oscillation frequency of the voltage control oscillator 16.

Figure 4A:
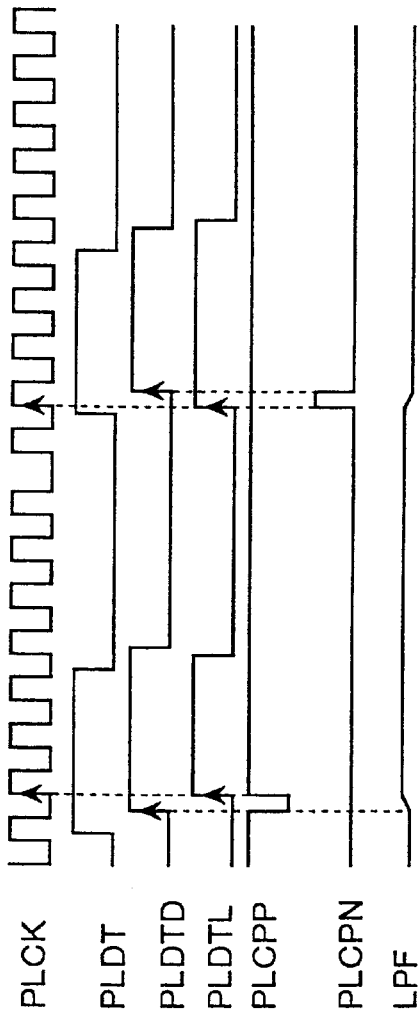
FIG. 4A and FIG. 4B are timing charts for explaining the operation of the data PLL circuit according to the first embodiment.
Figure 4B:
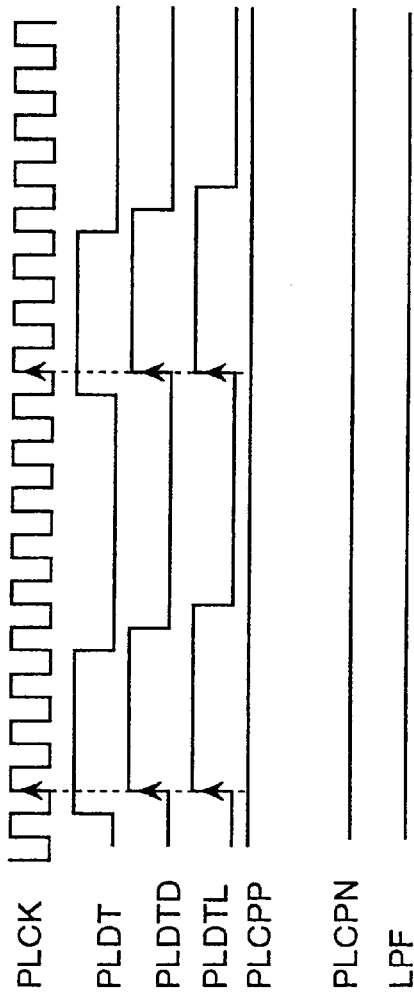

The following description will explain the data PLL circuit according to the first embodiment, and especially the operation of the phase comparator circuit 11. FIG. 4A and FIG. 4B are timing charts for explaining the operation of the data PLL circuit 10 as well as the operation of the phase comparator circuit 11.

First, as illustrated in FIG. 4A, the delay signal PLDTD which is delayed by a predetermined delay is obtained by inputting the input data PLDT into the DLL circuit 21. Meanwhile, the delay signal PLDTL is obtained by inputting the input data PLDT to the D-type flip-flop F21 and latching it with the leading edge of the oscillation clock PLCK.

These delay signals PLDTD and PLDTL are input to the phase comparator 22, and a phase comparison and a frequency comparison are performed. In the phase comparator 22, as illustrated in FIG. 4A, the low-level signal "L" is output as the signal PLCPP only during a period between the leading edge of the delay signal PLDTD and the leading edge of the next delay signal PLDTL.

Moreover, as shown in FIG. 4A, the phase comparator 22 outputs the high-level signal "H" as the signal PLCPN only during a period between the leading edge of the delay signal PLDTL and the leading edge of the next delay signal PLDTD.

With such an operation of the phase comparator 22, as illustrated in FIG. 4A, the control voltage generated by the low-pass filter 15 through the charge pump 14 in the later stage is increased in a period during which the signal PLCPP represents a low-level signal "L", held in the increased state until the signal PLCPN outputs a high-level signal "H" after the change of the signal PLCPP into a high-level signal "H", and decreased in a period during which the signal PLCPN outputs the high-level signal "H".

At least a time corresponding to one cycle of the delay signal PLDTL is required before the signal PLCPN outputs the high-level signal "H" after the signal PLCPP outputs the low-level signal "L". Hence, as shown in FIG. 4A, the change of the control voltage output from the low-pass filter 15 is moderate before phase locking.

Further, with the moderate change of the control voltage, phase locking is completed as shown in FIG. 4B. After the phase clocking, the pulse widths of the signals PLCPP and PLCPN approach zero as much as possible, and the delay signals PLDTD and PLDTL are in phase. In other words, a synchronized state is maintained, and the delay signal PLDTL representing a state in which the input data PLDT is synchronized with the oscillation clock PLCK is output as reproduced data to various signal processing sections, and bit data representing reproduced information is extracted by integrating the delay signal PLDTL and the oscillation clock PLCK.

This phase comparator circuit 11 is operated so that the leading edge of the oscillation clock PLCK is phase-locked with the leading edge of the delay signal PLDTD output from the DLL circuit 21. Here, by arranging the delay of the DLL circuit 21 to be just a half of a cycle of the oscillation clock PLCK, the leading edge of the input data PLDT and the trailing edge of the clock PLCK are synchronized with each other. Therefore, when extracting the input data PLDT with the leading edge of the oscillation clock PLCK, it is possible to provide a maximum phase margin.

As explained above, the data PLL circuit according to the first embodiment includes the DLL circuit 21 whose delay is controlled according to the delay control current supplied by the current control circuit 25 of the voltage control oscillator 16, the D-type flip-flop F21 and the phase comparator 22, and performs a phase comparison and a frequency comparison between the delay signal PLDTD obtained by inputting the input data PLDT into the DLL circuit 21 and the delay signal PLDTL obtained from the D-type flip-flop F21 which latches the input data PLDT with the leading edge of the oscillation clock PLCK output from the voltage control oscillator 16. It is thus possible to make the pulse widths of the phase-locked signals PLCPP and PLCPN output from the phase comparator 22 near zero, and to reduce jitter and offset of the phase-locked oscillation clock PLCK after phase locking. In addition, since the voltage control oscillator 16 and the DLL circuit 21 are linked, it is possible to obtain a delay proportional to the oscillation frequency of the voltage control oscillator 16 in the DLL circuit 21, and follow the change of the input data PLDT in a stable manner.

Moreover, in the phase comparator 11, since the input data PLDT is directly input into the DLL circuit 21, a circuit such as an edge detection circuit for outputting a pulse according to a timing of change of the input data PLDT is obviated, thereby achieving a more compact circuit structure.

Furthermore, by setting the delay of the DLL circuit 21 to a half of a cycle of the oscillation clock PLCK, it is possible to provide a maximum phase margin when extracting the input data PLDT with the leading edge of the oscillation clock PLCK. As a result, a sufficient time can be provided before the D-type flip-flop F21 latches the input data PLDT, thereby reducing the influence of jitter and enabling a stable synchronous operation.

Next, the following description will explain a data PLL circuit according to a second embodiment of the invention. The data PLL circuit according to the second embodiment is different from the phase comparator circuit 11 illustrated in the first embodiment. Specifically, the internal structure of the DLL circuit 21 shown in FIG. 3 is changed to include a selector which is supplied with delay signals output from variable delay stages 27, selects one of the delay signals and inputs the selected delay signal to the output stage 28.

Figure 5:
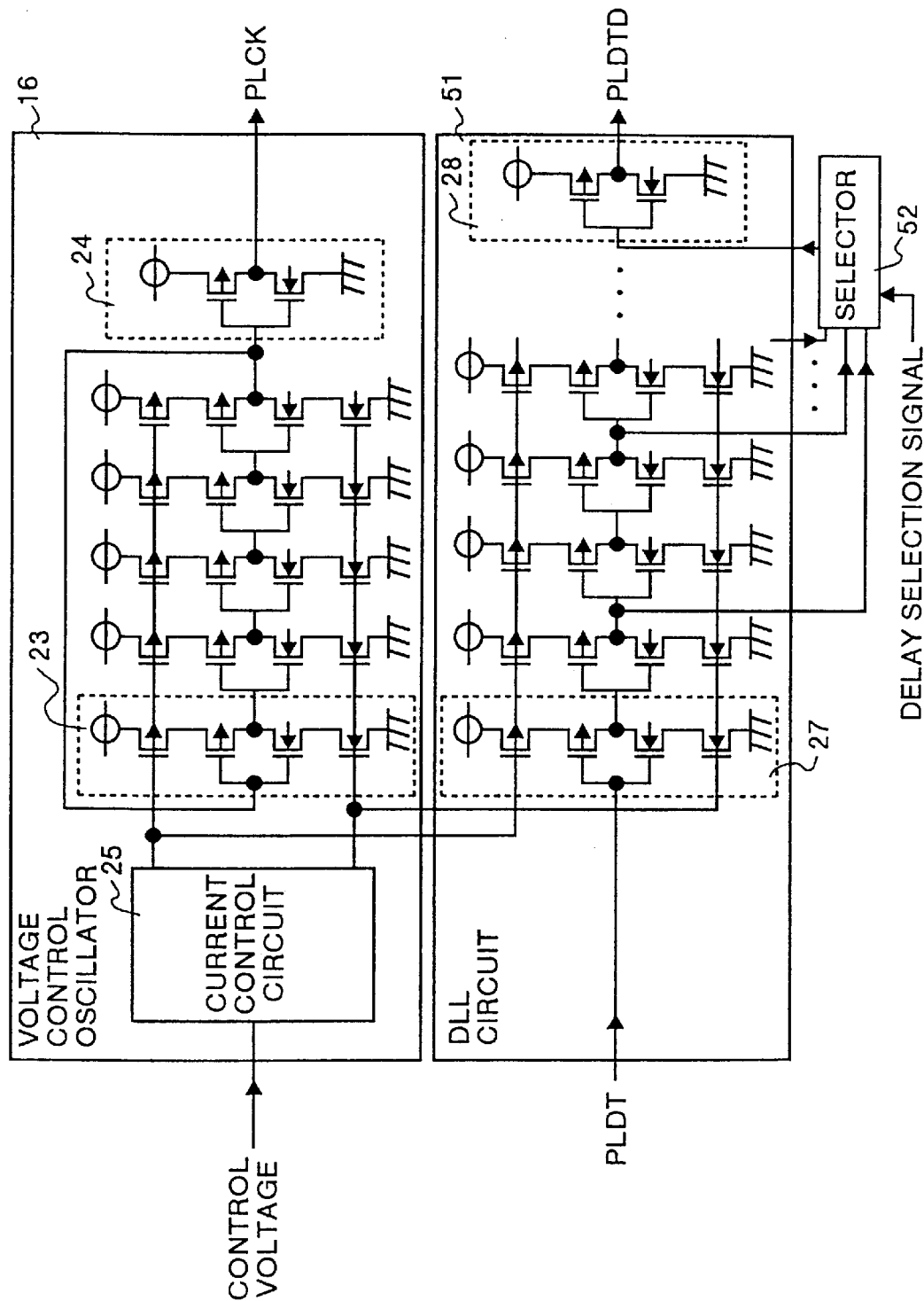
FIG. 5 is a circuit diagram showing an internal structure of a DLL circuit of a phase comparator circuit according to a second embodiment of the invention.

Except for the above-mentioned differences in the structure of the DLL circuit, the data PLL circuit according to the second embodiment has the same structures as those illustrated in FIG. 1 to FIG. 3. Therefore, the explanation of the structures will be omitted here. FIG. 5 is a circuit diagram showing an internal structure of a DLL circuit of a phase comparator circuit according to the second embodiment together with a circuit structure of the voltage control oscillator like FIG. 3. In FIG. 5, the same members as those shown in FIG. 3 are designated with the same codes and the explanation thereof will be omitted.

A comparison between a DLL circuit 51 shown in FIG. 5 with the DLL circuit 21 shown in FIG. 3 shows that each variable delay stage 27 has exactly the same structure as the variable delay stage 23 of the voltage control oscillator 16, the output of the final variable delay stage 27 is not input into the output stage 24 but the outputs of the respective variable delay stages 27 are input into a selector 52, and the output of the selector 52 is input into the output stage 28.

The selector 52 is a circuit which is supplied with the delay signals output from the respective variable delay stages 27 and inputs one of the delay signals into the output stage 28 according to a delay selection signal. Here, in the voltage control oscillator 16, when a delay control current supplied from the current control circuit 25 is fixed, the delay, i.e., the ON/OFF cycle of the switch section, is determined by the number of the variable delay stages 23.

The DLL circuit 51 is supplied with the current for controlling the variable delay stages 27 by the current control circuit 25 of the voltage control oscillator 16. Therefore, by forming the DLL circuit 51 with the same structures and same number of stages as the variable delay stages 23 constituting the voltage control oscillator 16, a delay introduced in the final variable delay stage 27 of the DLL circuit 51 can be made equal to a half of a cycle of the oscillation clock PLCK output from the voltage control oscillator 16.

Accordingly, for example, as illustrated in FIG. 5, by arranging the number of stages of the variable delay stages 23 constituting the voltage control oscillator 16 to be five stages and the number of stages of the variable delay stages 27 constituting the DLL circuit 51 to be ten stages, the delay obtained in the final variable delay stage 27 of the DLL circuit 51 is equal to the phase cycle of the oscillation clock PLCK output from the voltage control oscillator 16.

Here, in order to adjust the polarity of the clock, the delay signals output from the even-numbered variable delay stages 27 of the DLL circuit 51 are input into the selector 52, and one of these five delay signals is input into the output stage 28 by the delay selection signal. Consequently, the delay signal PLDTD which is adjustable as five-step delays obtained by dividing a time corresponding to one cycle of the oscillation clock PLCK by five, is provided.

Figure 6A:
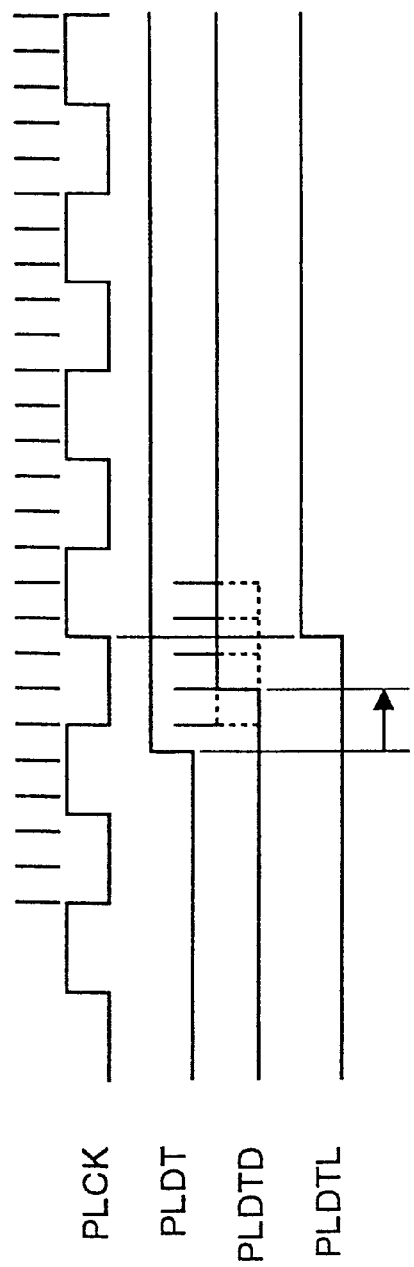
FIG. 6A and FIG. 6B are timing charts for explaining the operation of the data PLL circuit according to the second embodiment.
Figure 6B:
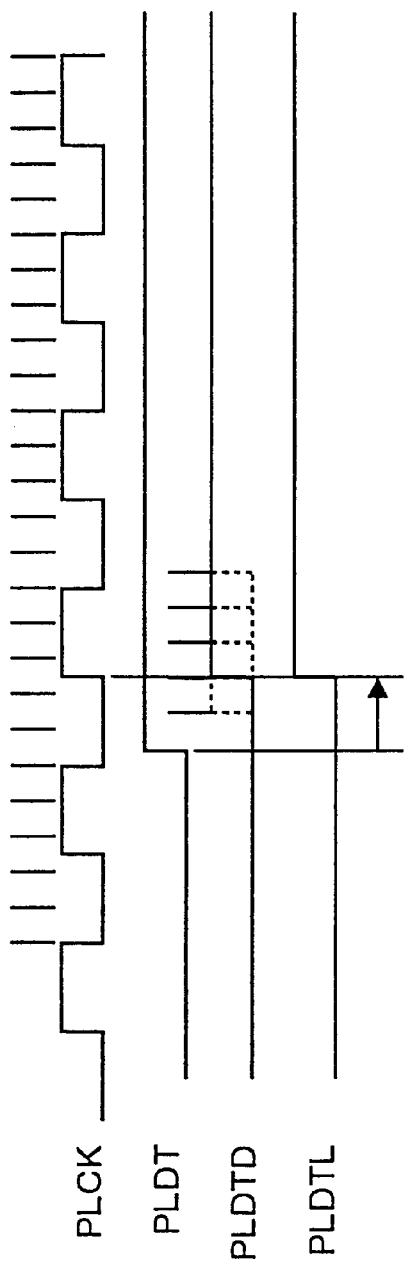

FIG. 6A and FIG. 6B are timing charts for explaining the operation of the data PLL circuit according to the second embodiment. FIG. 6A illustrates a state before starting a synchronous operation with respect to the delay signal PLDTD obtained by inputting the output of the fourth variable delay stage 27 into the output stage 28 through the selector 52 when the DLL circuit 51 is arranged to enable setting of the five-step delays as described above, i.e., a state before phase locking.

FIG. 6B illustrates a state in which phase locking by a PLL loop formed by the phase comparator circuit 11, charge pump 14, low-pass filter 15 and voltage control oscillator 16 is completed with respect to the state shown in FIG. 6A. In the data PLL circuit of the second embodiment, in this state, further, by appropriately changing the delay selection signal input to the selector 52, it is possible to forward the phase of the delay signal PLDTD by an amount corresponding to one step or delaying the phase by an amount corresponding to a maximum of three steps as shown in FIG. 6B.

Thus, by changing the phase of the delay signal PLDTD with the selector 52 after phase locking, the synchronous operation is further repeated, and the phase margin of the oscillation clock PLCK and input data PLDT can be adjusted to be maximum.

As explained above, in the data PLL circuit according to the second embodiment, the DLL circuit 51 whose delay is controlled according to the delay control current supplied by the current control circuit 25 of the voltage control oscillator 16, the selector 52, the D-type flip-flop F21 and the phase comparator 22 are included, a phase comparison and a frequency comparison between the delay signal PLDTD obtained by inputting the input data PLDT into the DLL circuit 51 and the delay signal PLDTL obtained from the D-type flip-flop F21 which latches the input data PLDT with the leading edge of the oscillation clock PLCK output from the voltage control oscillator 16 are performed, and the selector 52 selects one of the outputs of the variable delay stages 27 of the DLL circuit 51 and inputs the selected output into the output stage 28. Therefore, when extracting the input data PLDT with the leading edge of the oscillation clock PLCK, it is possible to adjust the phase of the delay signal PLDTL so as to maximize the phase margin between these edges, i.e., to obtain a sufficient time before latching the input data PLDT by the D-type flip-flop F21. Hence, the effects of jitter and offset are reduced, and a stable synchronous operation can be performed.

Moreover, since the delay of the DLL circuit 51 is controlled according to the delay control current supplied from the current control circuit 25 of the voltage control oscillator 16, the number of the delay signals PLDTD selected to find the maximum phase margin can be reduced by designing the variable delay stage 27 of the DLL circuit 51 to have the same structure as the variable delay stage 23 of the voltage control oscillator 16 and by designing the number of the variable delay stages 27 to be equal to or twice the number of the variable delay stages 23, thereby simplifying the structure of the DLL circuit 51.

Next, the following description will explain a data PLL circuit according to a third embodiment of the invention. A phase comparator circuit according to the third embodiment is characterized by the internal structure of the DLL circuit 51 shown in FIG. 5 which is designed so that the size of the MOS transistor serving as the switch section of each variable delay stage 27 and the size of the MOS transistor serving as the switch section of each variable delay stage 23 of the voltage control oscillator 16 satisfy a predetermined ratio. Except for the above-mentioned structure, the phase comparator circuit of the third embodiment is the same as the phase comparator circuit 11 illustrated in the second embodiment.

Figure 7:
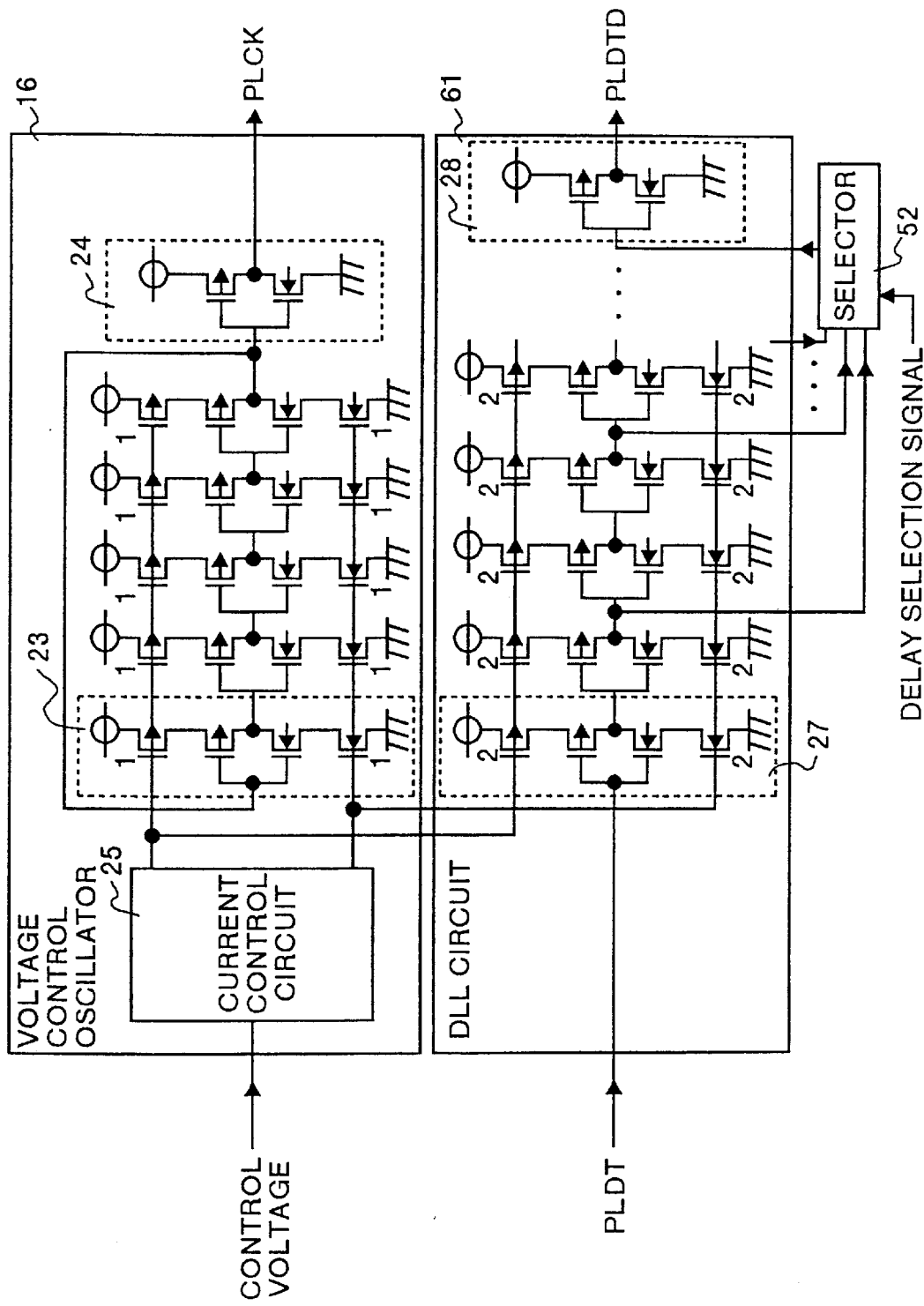
FIG. 7 is a circuit diagram showing an internal structure of a DLL circuit of a data PLL circuit according to a third embodiment of the invention.

FIG. 7 is a circuit diagram showing an internal structure of a DLL circuit of the data PLL circuit according to the third embodiment together with a circuit structure of the voltage control oscillator like FIG. 5. In FIG. 7, the same members as those shown in FIG. 5 are designated with the same codes and the explanation thereof will be omitted.

In general, it is known that the delays introduced in the variable delay stages 23 and 27 are inversely proportion to a size W/L of the MOS transistors serving as the switch sections of these variable delay stages. Here, W represents a channel width of the MOS transistor, and L is a channel length of the MOS transistor.

Therefore, by adjusting the transistor size W/L of the switch section constituting the variable delay stage 27 of a DLL circuit 61 with respect to the transistor size W/L of the switch section constituting the variable delay stage 23 of the voltage control oscillator 16, a delay which is different from the predetermined delay of the voltage control oscillator 16 by a desired time can be given to the DLL circuit 61.

In the voltage control oscillator 16 and DLL circuit 61 shown in FIG. 7, the ratio of the transistor size W/L of the switch section constituting the variable delay stage 23 of the voltage control oscillator 16 and the transistor size W/L of the switch section constituting the variable delay stage 27 of the DLL circuit 61 is 1:2.

With this transistor ratio, the delay introduced in each variable delay stage 27 of the DLL circuit 61 is about ½ times the delay introduced in each variable delay stage 23 of the voltage control oscillator 16. Here, as shown in FIG. 7, like the example illustrated in the second embodiment, when the voltage control oscillator 16 includes five variable delay stages 23, for example, if the DLL circuit 61 includes 20 variable delay stages 27 and the delay signals output from the even-numbered variable delay stages 27 are input into the selector 52 to adjust the polarity of the clock, it is possible to provide the delay signal PLDTD which is adjustable as ten-step delays obtained by dividing a time corresponding to one cycle of the oscillation clock PLCK by ten.

FIG. 8A and FIG. 8B are timing charts for explaining the operation of the data PLL circuit according to the third embodiment. FIG. 8A illustrates a state before starting a synchronous operation with respect to the delay signal PLDTD obtained by inputting the output of the tenth variable delay stage 27 into the output stage 28 through the selector 52, i.e., a state before phase locking, when the DLL circuit 61 is arranged to enable setting of the ten-step delays as described above.

FIG. 8B illustrates a state in which phase locking by the PLL loop formed by the phase comparator circuit 11, charge pump 14, low-pass filter 15 and voltage control oscillator 16 is completed with respect to the state shown in FIG. 8A. In the data PLL circuit according to the third embodiment, in this state, further, by appropriately changing the delay selection signal input to the selector 52, it is possible to forward the phase of the delay signal PLDTD by an amount corresponding to a maximum of four steps or delaying the phase by an amount corresponding to a maximum of five steps as shown in FIG. 8B.

Thus, by designing the voltage control oscillator 16 and DLL circuit 61 in such a way that the size of the MOS transistor serving as the switch section of the variable delay stage 23 and the size of the MOS transistor serving as the switch section of the variable delay stage 27 satisfy a predetermined ratio, it is possible to perform finer phase adjustment with respect to the input data PLDT, compared with the DLL circuit 51 of the second embodiment.

As explained above, in the data PLL circuit according to the third embodiment, the DLL circuit 61 whose delay is controlled according to the delay control current supplied by the current control circuit 25 of the voltage control oscillator 16, the selector 52, the D-type flip-flop F21 and the phase comparator 22 are included, a phase comparison and a frequency comparison between the delay signal PLDTD obtained by inputting the input data PLDT into the DLL circuit 61 and the delay signal PLDTL obtained from the D-type flip-flop F21 which latches the input data PLDT with the leading edge of the oscillation clock PLCK output from the voltage control oscillator 16 are performed, the selector 52 selects one of the outputs of the variable delay stages 27 of the DLL circuit 61 and inputs the selected output into the output stage 28, and the transistor size of the switch section of the variable delay stage 27 of the DLL circuit 61 is larger than the transistor size of the switch section of the variable resistor stage 23 of the voltage control oscillator 16 by a predetermined ratio. Therefore, when extracting the input data PLDT with the leading edge of the oscillation clock PLCK, it is possible to adjust the phase of the delay signal PLDTL finely so as to maximize the phase margin between these edges, i.e., to obtain a sufficient time before latching the input data PLDT by the D-type flip-flop F21. Hence, the effects of jitter and offset are reduced, and a stable synchronous operation can be performed.

Next, the following description will explain a data PLL circuit according to a fourth embodiment of the invention. A phase comparator circuit of the fourth embodiment is characterized by providing a frequency divider circuit in the front stage of the clock input (T) of the D-type flip-flop F21 shown in FIG. 2, inputting the oscillation clock PLCK output from the voltage control oscillator 16 into the frequency divider circuit, dividing the oscillation clock PLCK by a predetermined dividing ratio, and inputting the resultant signal as the oscillation clock PLCK into the clock input (T) of the D-type flip flop F21. Except for the above-mentioned structure, the phase comparator circuit of the fourth embodiment is the same as the phase comparator circuit 11 illustrated in the second embodiment.

Figure 9:
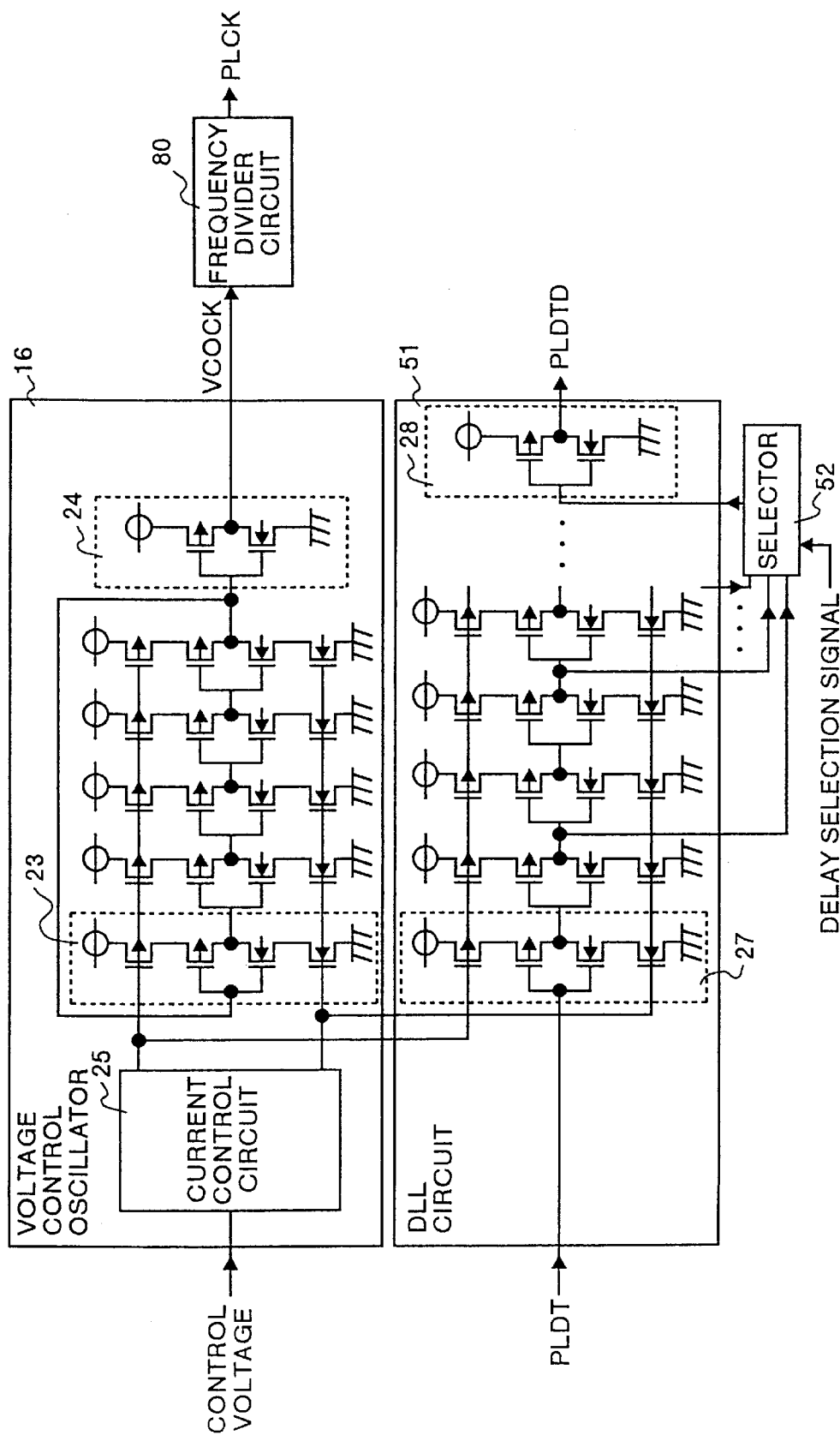
FIG. 9 is a circuit diagram showing a DLL circuit and a frequency divider circuit of a data PLL circuit according to a fourth embodiment of the invention.

FIG. 9 is a circuit diagram showing a DLL circuit and a frequency divider circuit of the data PLL circuit according to the fourth embodiment together with a circuit structure of the voltage control oscillator like FIG. 5. In FIG. 9, the same members as those shown in FIG. 5 are designated with the same codes and the explanation thereof will be omitted.

As illustrated in FIG. 9, an oscillation clock VCOCK output from the voltage control oscillator 16 is input into a frequency divider circuit 80. The oscillation clock VCOCK input into the frequency divider circuit 80 is divided by a predetermined dividing ratio, and output as a new clock PLCK. This oscillation clock PLCK is input as the clock input (T) into the D-type flip-flop F21 as explained in the first embodiment.

Here, the oscillation clock PLCK output from the frequency divider circuit 80 needs to be oscillated at the same oscillation frequency as the oscillation clock PLCK explained in the second embodiment. Therefore, the voltage control oscillator 16 must output the oscillation clock VCOCK at a frequency equal to or higher than the oscillation frequency of the oscillation clock PLCK. In other words, the frequency divider circuit 80 must set the dividing ratio so that the oscillation clock VCOCK is output as the oscillation clock PLCK having the above-described oscillation frequency.

Hence, as illustrated in FIG. 9, when the variable delay stages 27 of the DLL circuit 51 are controlled by the current control circuit 25 of the voltage control oscillator 16 and the variable delay stages 27 have the same structure as the variable delay stages 23, the delay of each variable delay stage 23 of the voltage control oscillator 16 is equal to the delay of each variable delay stage 27 of the DLL circuit 51. Thus, as described above, each variable delay stage 27 of the DLL circuit 51 is set at a frequency equal to or higher than the oscillation frequency of the oscillation clock PLCK, i.e., to a smaller delay.

Here, as shown in FIG. 9, like the example illustrated in the second embodiment, when the voltage control oscillator 16 includes five variable delay stages 23 and the oscillation clock VCOCK is oscillated at a frequency twice the oscillation clock PLCK, for example, if the DLL circuit 51 includes 20 variable delay stages 27 and the delay signals output from the even-numbered variable delay stages 27 are input into the selector 52 to adjust the polarity of the clock, it is possible to provide the delay signal PLDTD which is adjustable as ten-step delays obtained by dividing a time corresponding to one cycle of the oscillation clock PLCK by ten.

Figure 10A:
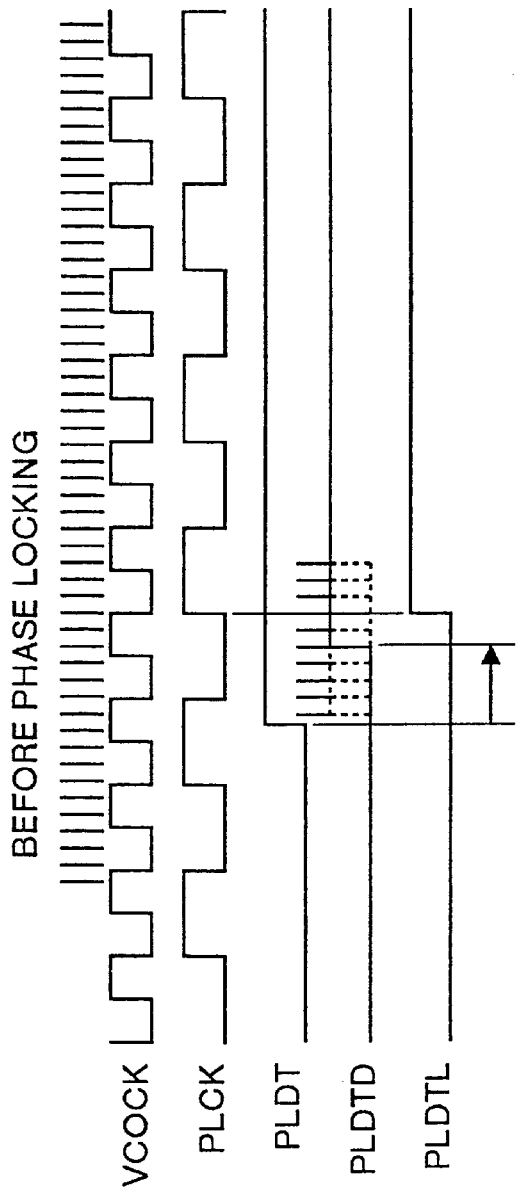
FIG. 10A and FIG. 10B are timing charts for explaining the operation of the data PLL circuit according to the fourth embodiment.
Figure 10B:
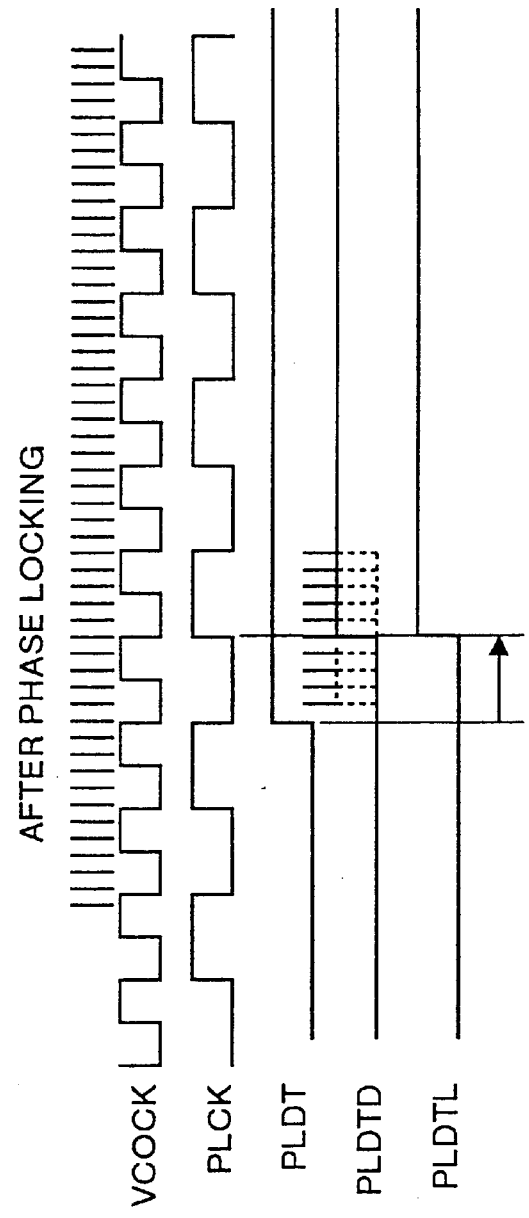

FIG. 10A and FIG. 10B are timing charts for explaining the operation of the data PLL circuit according to the fourth embodiment. FIG. 10B illustrates a state before starting a synchronous operation with respect to the delay signal PLDTD obtained by inputting the output of the tenth variable delay stage 27 into the output stage 28 through the selector 52, i.e., a state before phase locking, when the DLL circuit 51 is arranged to enable setting of the ten-step delays as described above.

FIG. 10B illustrates a state in which phase locking by the PLL loop composed of the phase comparator circuit 11, charge pump 14, low-pass filter 15 and voltage control oscillator 16 is completed with respect to the state shown in FIG. 10A. In the phase comparator circuit and data PLL circuit according to the fourth embodiment, in this state, further, by appropriately changing the delay selection signal to be input to the selector 52, it is possible to forward the phase of the delay signal PLDTD by an amount corresponding to a maximum of four steps or delaying the phase by an amount corresponding to a maximum of five steps as shown in FIG. 10B.

Thus, in the phase comparator circuit 11, the frequency divider circuit 80 is provided in the stage after the clock input (T) of the D-type flip-flop F21 shown in FIG. 2 (i.e., at a stage before the voltage control oscillator 16), and the voltage control oscillator 16 outputs the oscillation clock VCOCK at a frequency equal to or higher than the oscillation frequency of the oscillation clock PLCK. It is therefore possible to perform finer phase adjustment with respect to the input data PLDT, compared with the DLL circuit 51 of the second embodiment.

Incidentally, the frequency divider circuit 80 may be inserted as an element constituting the data PLL circuit 10 into a negative feedback loop between the voltage control oscillator 16 and phase comparator circuit 11, instead of being incorporated into the phase comparator circuit 11.

As explained above, in the data PLL circuit according to the fourth embodiment, the DLL circuit 51 whose delay is controlled according to the delay control current supplied by the current control circuit 25 of the voltage control oscillator 16, the selector 52, the D-type flip-flop F21 and the phase comparator 22 are included, a phase comparison and a frequency comparison between the delay signal PLDTD obtained by inputting the input data PLDT into the DLL circuit 51 and the delay signal PLDTL obtained from the D-type flip-flop F21 which latches the input data PLDT with the leading edge of the oscillation clock PLCK output from the voltage control oscillator 16 via the frequency divider circuit 80 are performed, the selector 52 selects one of the outputs of the variable delay stages 27 of the DLL circuit 51 and inputs the selected output into the output stage 28, the oscillation clock VCOCK output from the voltage control oscillator 16 is oscillated at a frequency equal to or higher than the oscillation frequency of the oscillation clock PLCK having a predetermined oscillation frequency, and therefore the delay of each variable delay stage of the DLL circuit is reduced. Thus, when extracting the input data PLDT with the leading edge of the oscillation clock PLCK, it is possible to adjust the phase of the delay signal PLDTL finely so as to maximize the phase margin between these edges, i.e., to obtain a sufficient time before latching the input data PLDT by the D-type flip-flop F21. Hence, the effects of jitter and offset are reduced, and a stable synchronous operation can be performed.

As explained above, according to the present invention, the delay unit such as a DLL circuit delays the input data such as a reproduced signal by an amount corresponding to the oscillation frequency of the voltage control oscillator to output the first delay signal, the latching unit such as a D-type flip-flop latches the input data according to the oscillation clock output from the voltage control oscillator to output the second delay signal, and the phase comparing unit compares the phase of the first delay signal and the phase of the second delay signal. It is therefore possible to provide a delay proportional to the oscillation frequency of the voltage control oscillator, with respect to the input data. For instance, by setting the amount of delay of the delay unit to a half of a cycle of the oscillation clock, a maximum margin can be obtained when extracting the input data with the leading edge of the oscillation clock. It is thus possible to obtain a sufficient time before the input data is latched by the latching unit. Consequently, the effects of jitter and offset are reduced, and a synchronous operation can be performed in a stable manner.

According to another aspect of the invention, the delay unit includes a plurality of the second variable delay stages which have the same structure and characteristics as the first variable delay stages constituting the voltage control oscillator and are connected in cascade, and the delay control current supplied to the switch section of the first variable delay stages of the voltage control oscillator is also used as the delay control current to be input into the switch section of the second variable delay stages. It is therefore possible to provide a delay proportional to the oscillation frequency of the voltage control oscillator with respect to the input data, and follow the change of the input data in a stable manner.

According to a further aspect of the invention, since the number of the second variable delay stages is an integral multiple of the number of the first variable delay stages constituting the voltage control oscillator, it is possible to set the amount of delay provided by the delay unit to a divisor of the oscillation cycle of the voltage control oscillator, follow the change of the input data in a stable manner, and further simplify the control of delay.

According to yet another aspect of the invention, since the phase comparing unit performs a phase comparison and a frequency comparison between the first delay signal and the second delay signal simultaneously, there is no need to newly provide a frequency comparator circuit, thereby enabling simplification of the circuit structure.

According to the an aspect of the invention, the phase comparing unit outputs a signal for increasing the frequency of the oscillation clock of the voltage control oscillator only in a period between the generation of a new leading edge of the first delay signal and the generation of a new leading edge of the second delay signal, and outputs a signal for reducing the frequency of the oscillation clock of the voltage control oscillator only in a period between the generation of a new leading edge of the second delay signal and the generation of a new leading edge of the first delay signal. Therefore, in a phase-locked state, no signals are output from this phase comparator circuit, thereby reducing the effects of jitter and offset.

According to still another aspect of the invention, since one of the outputs of the second variable delay stages is selected by the selecting unit and the selected output of the second variable delay stage is output as the first delay signal, it is possible to control the amount of delay.

According to a further aspect of the invention, since the selecting unit receives only the outputs of even-numbered second variable delay stages among the plurality of the second delay stages, it is possible to appropriately control the delay while considering the polarity of the clock.

According to an aspect of the invention, since the transistor size of the switch section of the second variable delay stage is designed to be an integral multiple of the transistor size of the switch section of the first variable delay stage, it is possible to control the delay by a unit of a divisor of the oscillation cycle of the voltage control oscillator because of the difference between the sizes of the transistors.

According to an aspect of the invention, since the frequency divider unit for dividing the oscillation clock is further provided and the latching unit latches the input data according to a division result output from the frequency divider unit, instead of the oscillation clock, it is possible to increase the oscillation frequency of the voltage control oscillator and consequently decrease the unit of control of the delay of the delay unit.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A phased locked loop (PLL) circuit comprising:

a voltage controlled oscillator generating an oscillation clock having a frequency and including a plurality of first variable delay stages;

a delay unit for outputting a first delay signal having a frequency and a phase, with a delay according to the frequency of said voltage controlled oscillator, of input data and including a plurality of second variable delay stages, said first and second variable delay stages being identical and respectively connected in cascade, wherein a delay control current supplied to switch sections of said first variable delay stages of said voltage controlled oscillator is also input to switch sections of said second variable delay stages;

a latching unit for outputting a second delay signal having a frequency and a phase, by latching the input data according to the oscillation clock output by said voltage controlled oscillator; and a phase comparing unit for comparing the phase of the first delay signal to the phase of the second delay signal.

2. The data PLL circuit according to claim 1, wherein said first and second variable delay stages are present in respective numbers and the number of said second variable delay stages is an integer multiple of the number of said first variable delay stages.

3. The data PLL circuit according to claim 1, wherein said phase comparing unit compares the frequency of the first delay signal to the frequency of the second delay signal simultaneously.

4. The data PLL circuit according to claim 1, wherein said phase comparing unit outputs a signal for increasing the frequency of the oscillation clock generated by said voltage controlled oscillator in a period between a generation of new leading edge of the first delay signal and generation of a new leading edge of the second delay signal, and outputs a signal for reducing the frequency of the oscillation clock of said voltage controlled oscillator in a period between a generation of new leading edge of the second delay signal and generation of a new leading edge of the first delay signal.

5. The data PLL circuit according to claim 1 further comprising a selecting unit for receiving outputs of the plurality of said second variable delay stages and selecting one of the received outputs of said second variable delay stages, wherein said delay unit outputs the output of said second variable delay stage selected by said selecting unit, as the first delay signal.

6. The data PLL circuit according to claim 5, wherein said selecting unit receives only the outputs of even-numbered second variable delay stages among the plurality of said second delay stages.

7. The data PLL circuit according to claim 1, wherein switch sections of said first and second variable delay stages include respective transistors having sizes and a transistor of a switch section of said second variable delay stage has a size that is an integer multiple of the size of a transistor of a switch section of said first variable delay stage.

8. A data PLL circuit according to claim 1 comprising a frequency divider unit for dividing the oscillation clock, wherein said latching unit latches the input data according to a result of a division by said frequency divider unit, instead of the oscillation clock.

* * * * *